(12) United States Patent
Chen et al.

(10) Patent No.: US 7,929,646 B2
(45) Date of Patent: Apr. 19, 2011

(54) MAP DECODER WITH BIDIRECTIONAL SLIDING WINDOW ARCHITECTURE

(75) Inventors: Pei Chen, San Diego, CA (US); Ivan Jesus Fernandez-Corbaton, Nuremberg (DE); Jordi de los Pinos Pont, San Diego, CA (US)

(73) Assignee: Qualcomm Incorporated, San Diego, CA (US)

( * ) Notice: Subject to any disclaimer, the term of this patent is extended or adjusted under 35 U.S.C. 154(b) by 1000 days.

(21) Appl. No.: 11/441,653

(22) Filed: May 25, 2006

(65) Prior Publication Data

US 2007/0177696 A1 Aug. 2, 2007

Related U.S. Application Data

(60) Provisional application No. 60/762,764, filed on Jan. 27, 2006.

(51) Int. Cl.
*H04L 27/06* (2006.01)

(52) U.S. Cl. ......... 375/341; 375/253; 375/262; 375/265

(58) Field of Classification Search ............... 375/341, 375/253, 262, 265
See application file for complete search history.

(56) References Cited

U.S. PATENT DOCUMENTS

| | | | |
|---|---|---|---|
| 6,754,290 | B1 | 6/2004 | Halter |
| 2002/0174401 | A1* | 11/2002 | Wang et al. ............ 714/786 |
| 2003/0097633 | A1* | 5/2003 | Nguyen ............ 714/786 |
| 2004/0111659 | A1 | 6/2004 | Lu et al. |

FOREIGN PATENT DOCUMENTS

EP 1521374 A 4/2005

OTHER PUBLICATIONS

Yoon et al. (Turbo Decoder Implementation, 2001, IEEE, vol. 3, pp. 1824-1828).*

Zhongfeng Wang et al: "Area-Efficient High-Speed Decoding Schemes for Turbo Decoders", IEEE Transactions on Very Large Scale Integration (VLS() Systems, IEEE Service Center, Piscataway, NJ, US, vol. 10, No. 6, Dec. 2002; XP-011080598; ISSN: 1063-8210; Abstract.

(Continued)

*Primary Examiner* — Shuwang Liu
*Assistant Examiner* — Kabir A Timory
(74) *Attorney, Agent, or Firm* — Turocy & Watson, LLP

(57) ABSTRACT

A MAP decoder, or a turbo decoder having constituted MAP decoders, is configured with bi-directional sliding windows. A sliding window architecture is applied to the forward state metric (FSM) calculation of an encoded data block having a trellis with N time-steps. The data block is divided into smaller sub-blocks and a forward recursion of two or more of the sub-blocks are performed in parallel to obtain FSMs. Each sub-block overlaps with a previous sub-block by k time-steps, where k is an integer value greater than zero. This provides a good approximation of the FSMs at time-step k+t of the sub-block. The FSMs associated with the first k time steps of each sub-block, other than the first sub-block, are discarded. A reverse recursion of each sub-block is also performed to obtain reverse state metrics (RSM) for the sub-block. Likelihood ratios are then calculated based on the FSMs and RSMs.

29 Claims, 6 Drawing Sheets

OTHER PUBLICATIONS

Jah-Mind Hsu et al.: "A parallel decoding scheme for turbo codes", Circuits and Systems, 1998, ISCAAS 1998, Proceedings of the 1998 IEEE International Symposium on Monterey, Ca, USA May 31-Jun. 3, 1998, New York,, NY US, IEEE, US. May 31, 1998, pp. 455-448, XP010289456; ISMN: 0-7803-4455-3; Abstract; pp. 445-447; Figs. 1, 4a; 4b, 5, 6.

Mansour M M et al.: "VLSI architectures for SISO-APP Decoders", IEEE Transactions on Very Large Scale Intergration (VLSI) systems IEEE USA, vol. 11, No. 4, Aug. 2003, pp. 627-650, XP002428902; ISSN: 1063-8210; pp. 637-639; Fig 10.

Yuping Zhang et al: "Parallel Turbo Decoding" Circuists and Systems, 2004, ISCAS '04, Proceedings of the 2004 International Syposium on Vancouver, BC, Canada May 23-26, 2004, pp. 509-512, XP010720217; ISMB: 0-7803-8251-X; p. 510, right-hand column, pp. 511, Fig. 5.

International Search Report dated Jun. 20, 2007 for PCT Application Serial No. PCT/US2007/061244, 4 Pages.

Office Action mailed Dec. 21, 2009 for Korean Patent Application Serial No. 2008-7021060, 7 pages.

Jah-Ming Hsu and Chin-Liang Wang, "A Parallel Decoding Scheme for Turbo Codes", 1998 IEEE, Downloaded on Dec. 22, 2009 at 23:24 from IEEE Xplore, 4 Pages.

Office Action dated Sep. 6, 2010 for European Patent Application Serial No. 07762476.5, 3 pages.

International Preliminary Report on Patentability for PCT Patent Application No. PCT/US2007/061244, dated Jul. 29, 2008, 18 pages.

Office Action dated Jun. 30, 2010 for Korean Patent Application Serial No. 2008-7021060, 7 pages.

Hsu Jah-Ming et al. 'A Parallel Decoding Scheme For Turbo Codes', '98 ISCAS, pp. 445-448 (May 31, 1998), 4 pages.

* cited by examiner

| Time | T0 → | T1 → | T2 → | T3 → | T4 → | T5 → | T6 → |
|---|---|---|---|---|---|---|---|
| Segments | W | 2xW | 3xW | 4xW | 5xW | 6xW | 7xW |
| FSMC | 0 to W-1 | W to 2W-1 | 2W to 3W-1 | 3W to 4W-1 | 4W to 5W-1 | 5W to 6W-1 | |
| RSMC | | W-1 to 0 | 2W-1 to W | 3W-1 to 2W | 4W-1 to 3W | 5W-1 to 4W | 6W-1 to 5W |
| LLR | | W-1 to 0 | 2W-1 to W | 3W-1 to 2W | 4W-1 to 3W | 5W-1 to 4W | 6W-1 to 5W |
| Memory | $A_{0, W-1}$ | $A_{0, 2W-1}$ | $A_{W, 3W-1}$ | $A_{2W, 4W-1}$ | $A_{3W, 5W-1}$ | $A_{4W, 6W-1}$ | $A_{4W, 6W-1}$ |

MAP DECODER WITH BIDIRECTIONAL SLIDING WINDOW ARCHITECTURE

CLAIM OF PRIORITY UNDER 35 U.S.C. §119

The present application for patent claims priority to Provisional Application No. 60/762,764 entitled "MAP Decoder with Bi-Directional Sliding Window Architecture" filed Jan. 27, 2006, and assigned to the assignee hereof and hereby expressly incorporated by reference herein.

BACKGROUND

1. Field

Various embodiments of the invention pertain to communication systems and more particularly, to a device and/or method for decoding data in digital communication systems.

2. Background

Communication systems use numerous techniques to increase the amount of information transferred while minimizing transmission errors. In these communication systems, the information is typically represented as a sequence of binary bits or blocks of bits called frames. The binary information is modulated to signal waveforms and transmitted over a communication channel. Communication channels tend to introduce noise and interference that corrupt the transmitted signal. At a receiver the received information may be corrupted and is an estimate of the transmitted binary information. The number of bit errors or frame errors depends on the amount of noise and interference in the communication channel.

To counter the effects of transmission channel corruption, error correction coding is often used in digital communication systems to protect the digital information from noise and interference and reduce the number of bit/frame errors. Channel coding is typically accomplished by selectively introducing redundant bits into the transmitted information stream. These additional bits allow detection and correction of bit errors in the received data stream thereby providing more reliable transmissions.

One type of error correction code, known as turbo code, has near-Shannon-limit error correcting performance. The basis of turbo coding is to introduce redundancy in the data to be transmitted through a channel. The redundant data helps to recover original data from the received data. A turbo code can achieve a transmission performance to within approximately 1 dB of the Shannon channel capacity.

A well-known axiom in communications theory is that a randomly chosen code of sufficiently large block length n is capable of approaching the Shannon channel capacity limit. However, the decoding of such a code increases with n up to a point where decoding becomes physically unrealizable.

One type of decoder for turbo codes is the Maximum A Posteriori (MAP) algorithm, also known as A Posteriori Probability (APP) algorithm. The MAP algorithm decodes a block by performing a forward recursion and then a reverse recursion of a binary trellis tree of the block to obtain a pair of state metrics for each state in the trellis. The forward recursion of the trellis tree decodes the block in the forward direction to obtain a first estimate (forward state metric) of the information sequence. The reverse recursion (also known as backward recursion) of the trellis tree decodes the block in the reverse direction to obtain a second estimate (reverse state metric) of the information sequence. In implementing conventional MAP algorithms, one problem is that storing the forward state metrics and reverse state metrics can take an extraordinary amount of memory even for a modest constraint length and code block length.

Another difficulty with conventional MAP algorithms is that the sequential processing (i.e., forward recursion and reverse recursion) may fail to satisfy a constraint on decoding time. Specifically, performing a forward recursion and then a reverse recursion of the binary trellis of a block may take a longer time than is permissible by rate sensitive applications. The decoding of a data block may take longer than expected by rate sensitive applications.

SUMMARY

In one aspect, a decoder comprises a block divider for dividing a data block into a plurality of sub-blocks using a sliding window architecture; a first decoder coupled to the block divider to receive the plurality of sub-blocks, the first decoder including a plurality of parallel decoders that determine a first set of state metrics for at least two of the plurality of sub-blocks in parallel; and a second decoder coupled to the first decoder to receive the plurality of sub-blocks from the first decoder and compute a second set of state metrics for the plurality of sub-blocks. The first and second decoders may implement a maximum a posteriori probability (MAP) algorithm to correct errors in the data block. The first and/or second decoder may determine forward state metrics for a trellis of the data block. The second decoder may further divide each sub-block received from the first decoder into a plurality of smaller segments and compute the second set of state metrics using a sliding window architecture on the plurality of smaller segments. The second decoder may include a plurality of parallel decoders, wherein each parallel decoder in the second decoder corresponding to one of the plurality of parallel decoders in the first decoder. Each sub-block may include a plurality of segments, wherein the second decoder may be configured to compute the second set of state metrics for a segment once the first decoder has computed the first set of state metrics for that segment.

In another aspect, a method for recursively decoding information in an encoded block, comprises dividing the encoded data block into a plurality of smaller sub-blocks, each sub-block including a plurality of smaller segments; obtaining forward state metrics for two or more of the sub-blocks in parallel; and obtaining reverse state metrics for a segment once forward state metrics have been obtained for that segment. The method may further comprise receiving the encode block of information having a trellis with N time steps; dividing the encoded block into N/L sub-blocks, where L is an integer greater than zero; and computing forward state metrics for the N/L sub-blocks in parallel. Alternatively, the method may further comprise storing the first set of metrics for a first segment of each sub-block; obtaining likelihood ratios for the first segment based on the first and second state metrics for the first segment; and discarding the first set of metrics for the first segment of each sub-block once likelihood ratios for the first segment are obtained.

In the above decoder and method, each sub-block may overlap with the previous sub-block by k time steps of the trellis, where k is an integer value greater than zero. The metrics associated with the first k time steps for each sub-block after a first sub-block may be discarded from the first set of state metrics. The length of the sub-blocks may be determined by a decoding time constraints. The data block may be encoded with a turbo code. The first set of metrics for a segment may be discarded from the storage device once likelihood ratios for the segment have been calculated. The first set of state metrics and the second set of state metrics may be used in calculating likelihood ratios for data in the data block.

It should be noted that the decoder and/or method as described may be implemented by a processor configured to perform one or more functions of the decoder and/or method. Similarly, the decoder and/or method as described may be implemented by a machine readable medium comprising instructions, wherein the instruction are configured to perform one or more functions of the decoder and/or method.

DETAILED DESCRIPTION

Figure 1:
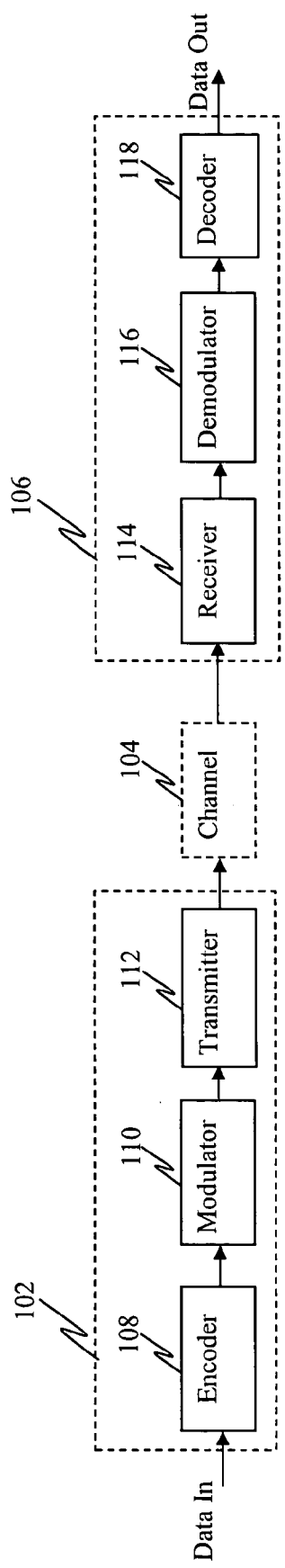
FIG. 1 illustrates a block diagram of an example communication system in which one or more features of the present invention may be implemented.

In the following description, specific details are given to provide a thorough understanding of the embodiments. However, it will be understood by one of ordinary skill in the art that the embodiments may be practiced without these specific details. For example, circuits may be shown in block diagrams in order not to obscure the embodiments in unnecessary detail.

Also, it is noted that the embodiments may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed. A process may correspond to a method, a function, a procedure, a subroutine, a subprogram, etc. When a process corresponds to a function, its termination corresponds to a return of the function to the calling function or the main function.

Moreover, a storage medium may represent one or more devices for storing data, including read-only memory (ROM), random access memory (RAM), magnetic disk storage mediums, optical storage mediums, flash memory devices, and/or other machine readable mediums for storing information. The term "machine readable medium" includes, but is not limited to portable or fixed storage devices, optical storage devices, wireless channels, and various other mediums capable of storing, containing, or carrying instruction(s) and/or data.

Furthermore, embodiments may be implemented by hardware, software, firmware, middleware, microcode, or a combination thereof. When implemented in software, firmware, middleware, or microcode, the program code or code segments to perform the necessary tasks may be stored in a machine-readable medium such as a storage medium or other storage means. A processor may perform the necessary tasks. A code segment may represent a procedure, a function, a subprogram, a program, a routine, a subroutine, a module, a software package, a class, or a combination of instructions, data structures, or program statements. A code segment may be coupled to another code segment or a hardware circuit by passing and/or receiving information, data, arguments, parameters, or memory contents. Information, arguments, parameters, data, and the like, may be passed, forwarded, or transmitted via a suitable means including memory sharing, message passing, token passing, and network transmission, among others.

Generally, a MAP decoder or turbo decoder having constituent MAP decoders (e.g., recursive forward and reverse decoders) with bi-directional sliding windows is disclosed. Data blocks into the forward decoder are subdivided into sub-blocks and the forward recursion of the sub-blocks are performed in parallel. This approach recognizes that the forward recursion for calculating forward state metrics does not have to start from the first time step of the trellis. Instead, a sliding window architecture is applied to the forward state metric calculation. This may reduce the storage space used for forward state metrics (over a conventional algorithm) and may also reduce the decoding time because the forward state metrics are calculated in parallel.

Additionally, on the reverse decoder, the sub-blocks from the forward decoder can be subdivided even further. A sliding window architecture for the reverse state metric calculation can also be applied to each of the sub-blocks (or forward sliding windows), thus reducing storage used for the forward state metrics.

FIG. 1 illustrates a block diagram of an example communication system in which one or more features of the present invention may be implemented. The communication system includes a first device 102 that encodes information for transmission over a communication channel 104 to a second device 106 that decodes the information. First device 102 includes an encoder 108 that receives data and encodes with an error correcting code. The encoded data is then sent to a modulator 110 that modulates the information onto a carrier signal which is then transmitted by a transmitter 112. Communication channel 104 may be any medium, including wire, wireless, radio, satellite, or a combination thereof, that carries the encoded information to the receiving second device 106. Second device 106 includes a receiver 114 and demodulator 116 that demodulates the received signal and provides packets, frames, or blocks of data to a decoder 118. Decoder 118 decodes the information to provide a data output. Decoder 118 may be configured to implement a Maximum A Posteriori (MAP) algorithm, also known as A Posteriori Probability (APP) algorithm.

Figure 2:
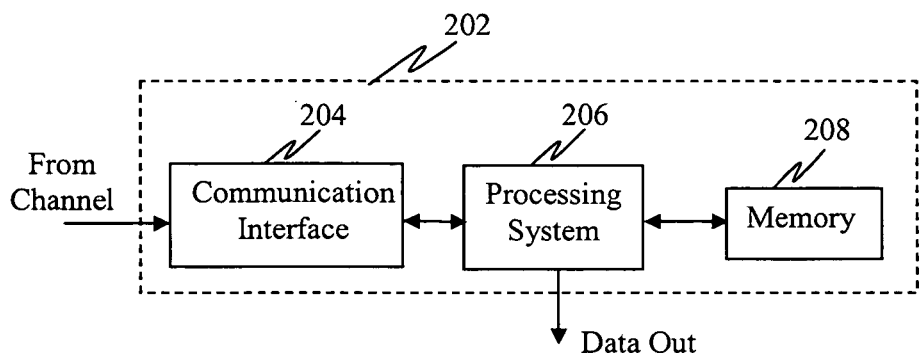
FIG. 2 is a block diagram illustrating an example receiving device configured to perform data decoding.

FIG. 2 is a block diagram illustrating an example receiving device 202 configured to decode data. Receiving device 202 includes a communication interface that receives information-bearing signals from a communication channel. Communication interface 204 then sends the received information-bearing signals to a processing system 206 which is configured to decode the information in the received signals.

Processing system 206 is configured to function as a MAP decoder or turbo decoder having constituent MAP decoders (e.g., recursive forward and reverse decoders) and implement sliding windows on both the forward and reverse recursion paths of the decoders. Information received from communication interface 204 is subdivided into smaller blocks (i.e., sub-blocks) and the forward recursion function is performed in parallel on two or more of the sub-blocks. For this purpose, processing system 206 may include one or more processors, application-specific integrated circuits (ASICs), and/or decoding devices configured to operate in parallel. A forward decoder calculates state metrics from the beginning to the end of a sub-block while the reverse decoder calculates metrics from the end to the beginning of the sub-block. A memory device 208 may be coupled to processing system 206 to store forward and/or reverse state metrics generated during the decoding process.

An additional feature provides that the processing system 206 is also configured to implement a reverse decoder having a sliding window architecture for the reverse state metric calculation of each of the subdivided smaller blocks. When implementing the reverse decoder, the subdivided smaller blocks from the forward decoder can be subdivided even further and the sliding window architecture is applied in parallel to each of the sub-blocks of the forward state metric calculator. Thus, the features disclosed reduce the storage used for the forward and/or reverse state metrics and further reduce the decoding time due to the parallel decoding on the forward and/or reverse decoder.

In some implementations, the sliding window architecture for the reverse state metric calculation is applied to a sub-block of the forward state metric calculator even before the forward state calculation is completed on the sub-block. That is, the sliding window architecture for the reverse state metric calculation means that the reverse state metric calculations are performed on segments of a sub-block as the forward state metric calculations for said segments are completed. Thus, the reverse state metric calculations of segments of a sub-block may occur while the forward state metric calculations for other segments of the sub-block are still taking place. This expedites the overall calculations since there is no need to wait until all forward state calculations for a sub-block are completed. In some implementations, the forward metrics for a segment are calculated first followed by the calculation of the reverse state metrics for the same segment. In other implementations, the reverse state metrics for a segment or sub-block are calculated first followed by the calculation of the forward state metrics for the sub-block or segment. In yet other implementations, the forward and reverse metrics for a segment are calculated approximately simultaneously. Even though some of the examples may illustrate one of these sequences and not others, it should be understood that the present invention may be applied to any of these configurations without departing from the invention.

The forward and reverse state metrics are then used to calculate the likelihood ratios (e.g., log-likelihood ratios) for sub-blocks. In one implementation, the current set of forward state metrics and the calculated log-likelihood ratios are stored in memory 208. There is no need to store the reverse state metrics since the log-likelihood ratios are calculated along with the reverse state metrics.

Figure 3:
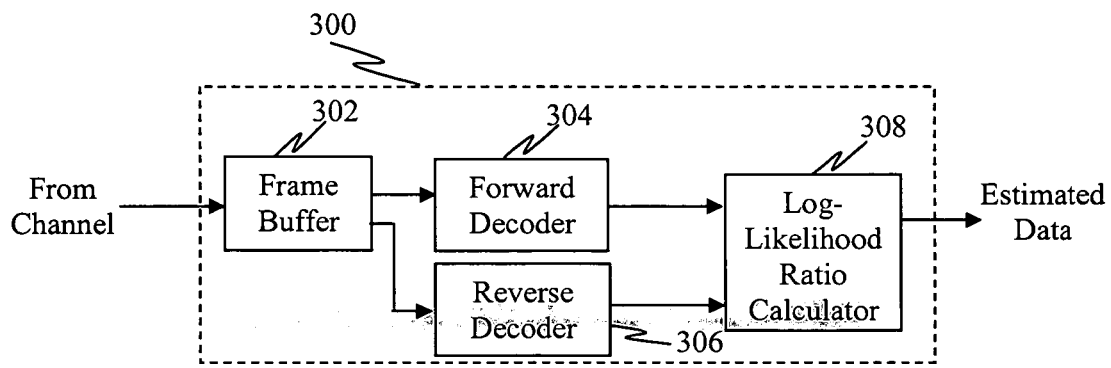
FIG. 3 is a block diagram illustrating an example decoder having a sliding window architecture and parallel decoding on the forward decoder according to one feature of the invention.

FIG. 3 is a block diagram illustrating an example decoder 300 having a sliding window architecture and parallel decoding on the forward decoder. Decoder 300 may perform as a decoder implementing a MAP algorithm. Decoder 300 includes a frame buffer 302 that receives binary information from a communication channel. The received binary information is sent to a forward decoder 304 as a data block. The data block (e.g., window) is subdivided into smaller data blocks (e.g., sub-blocks or sliding windows) which are then processed in parallel by forward decoder 304. That is, forward decoder 304 performs forward recursion of the binary trellises of the sub-blocks. Each path through a trellis represents a unique binary sequence of states in time, where each state in time is assigned a probability. Said probability specifies the likelihood of whether a particular binary state in time is either 1 or 0. These probabilities are stored as a forward state metrics. A reverse decoder 306 then traverses the trellis in the reverse direction, and generates another set of probabilities as reverse state metrics. A likelihood ratio calculator 308 then calculates log-likelihood ratios or A Posteriori Probabilities (APP) based on the forward state metrics and the reverse state metrics.

The forward state metric calculation is a recursive function that is based on the forward state metrics from previous time steps. Starting from an unknown state with equally likely probabilities for all the possible states at a time step t, forward state metric calculations through k times steps, where k depends on the constraint length of the code, produces a good approximation of the forward state metrics at time step t+k. The next forward state metrics can then be calculated starting from the approximation at time t+k. Since it is possible to build up good approximations for forward state metrics starting from any point in the trellis, a sliding window architecture can be applied to the forward state metric calculation and process all the sliding windows for the forward state metric calculation in parallel.

Figure 4:
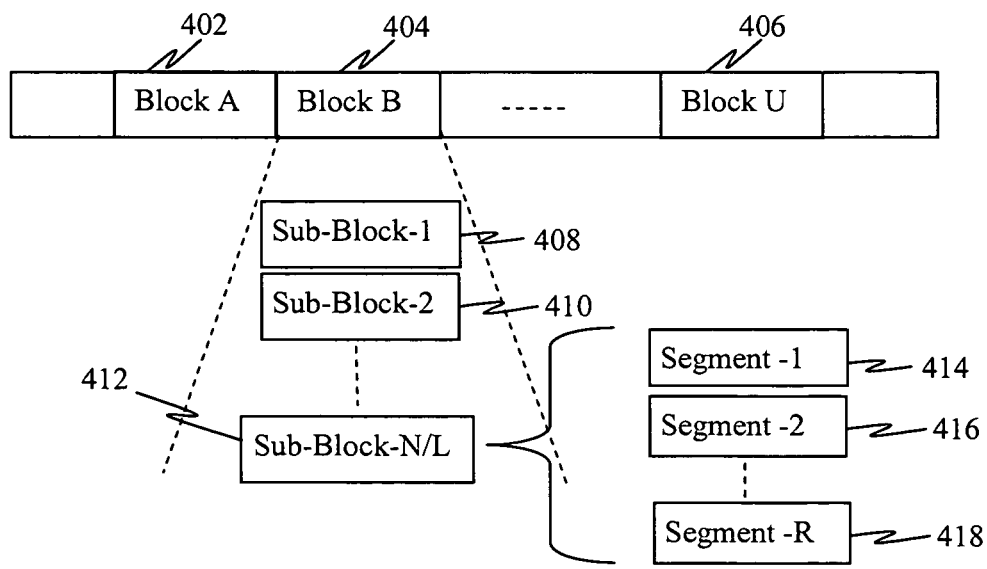
FIG. 4 illustrates an example of how blocks of information are divided into smaller sub-blocks in a sliding window architecture for a forward decoder.

FIG. 4 illustrates an example of how encoded information blocks 402, 404, and 406 are divided into smaller sub-blocks 408, 410, and 412 in a sliding window architecture for a forward decoder. A length L for the sliding window of the forward decoder is selected based on the decoding time constraint. The decoding time constraint is based on the application data rate. The higher the application data rate the faster the decoding requirements, meaning the sliding window has a smaller length L.

A block 404, having N time steps in its trellis, is divided into N/L sub-blocks 408, 410, and 412. The forward state metrics of the N/L sub-blocks 408, 410, and 412 are computed in parallel. The first sub-block 408 is of length L. It starts from the first time step (of block B 404) and from the all zero state (a known state). The other sub-blocks 410 and 412 are of length L+k, with each sub-block overlapping with the previous sub-block by k time steps of the trellis. For instance, sub-block-2 410, which follows sub-block-1 408, includes the last k time steps from sub-block-1 408. The nth sub-block (where n>1) starts from the ((n−1)L+1−k)th time steps with equally likely states. By starting the nth sub-block k time steps "early", a good approximation of the forward state metrics at time step k+t of the sub-block can be obtained (where t is an integer greater than or equal to zero). The forward state metrics for the first k time steps in all of the sliding windows, other than the first window, are then discarded.

To perform the reverse state metric calculations, the sub-blocks may be subdivided even further into smaller sub-blocks or segments 414, 416, and 418. The reverse state metric calculations are then performed on the segments 414, 416, and 418. In order to expedite the overall calculation of the log-likelihood ratios of the trellis, the reverse state metric calculations of the segments may be started even before the forward state metric calculation for the corresponding whole sub-block is completed. Thus, once the forward state metric calculations are completed for a portion of a sub-block corresponding to a segment, the reverse state metric calculations can be started on that segment. Note that in other implementations, the reverse state metric calculations may be performed prior to or approximately simultaneously with the forward state metric calculations without departing from the invention.

Figure 5:
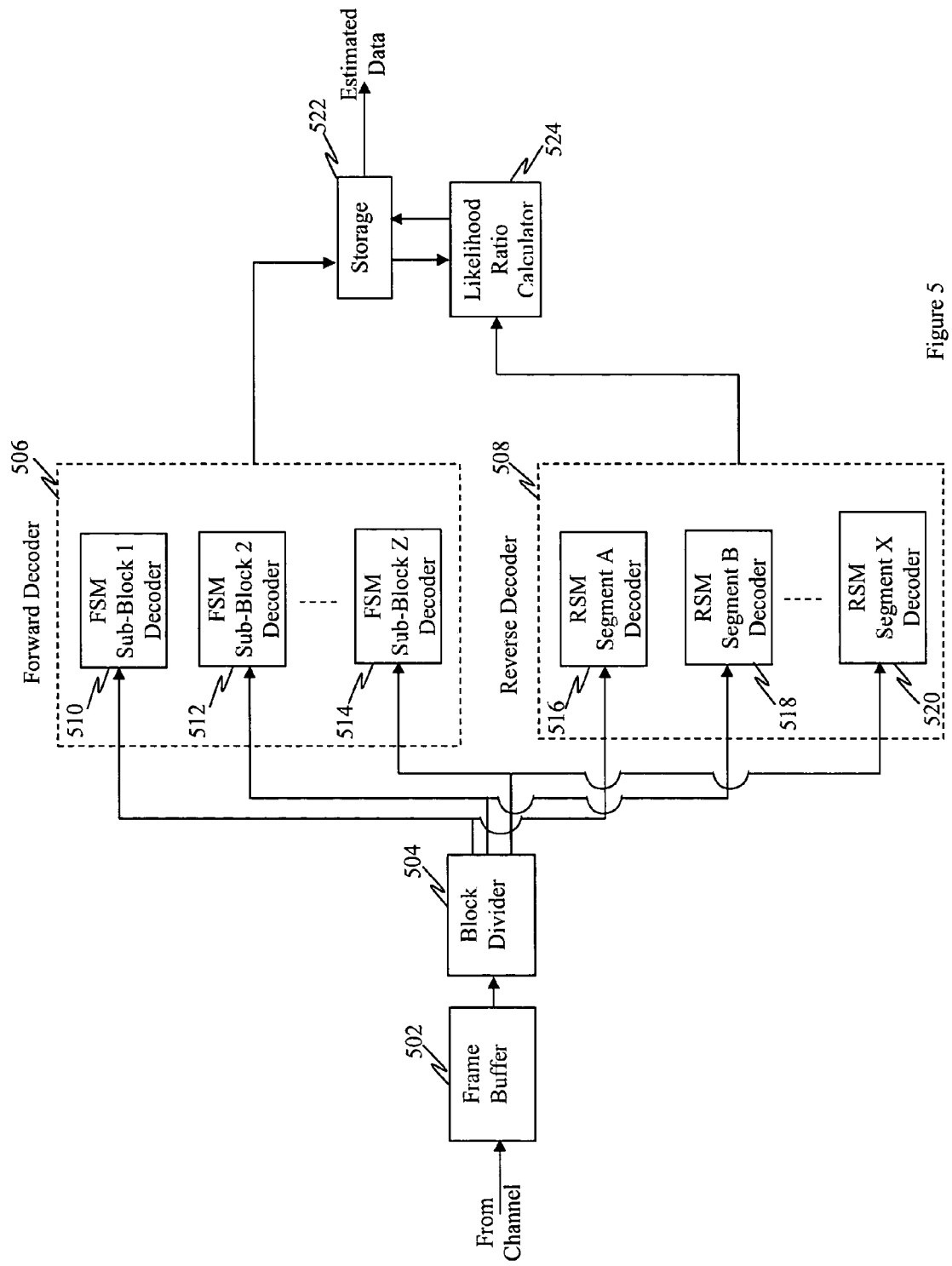
FIG. 5 illustrates a block diagram of an example decoder structure having multiple parallel decoders.

FIG. 5 illustrates a block diagram of an example decoder structure having multiple parallel decoders. A frame buffer 502 receives binary data or symbols from a communication channel. A block divider 504 divides a data block into a plurality of smaller data sub-blocks. In one implementation, a sliding window architecture is employed in dividing the data block into the plurality of forward state metric (FSM) sub-blocks, each FSM sub-block overlapping with the previous FSM sub-block by k time steps. The plurality of FSM sub-blocks are then directed to a forward decoder 506 having a plurality of parallel decoders (e.g., processors, ASICs, etc.) 510, 512, and 514. By generating the forward state metrics in parallel, forward decoder 506 generates the metrics in less time.

The FSM sub-blocks from forward decoder 506 may be further subdivided into smaller sub-blocks or segments (e.g., segments 414, 416, and 418 in FIG. 4). The reverse state metric calculations are performed on these smaller segments. A reverse decoder 508 includes a plurality of reverse state metric (RSM) segment decoders 516, 518, and 520 that generate reverse state metrics for segments of sub-blocks from corresponding FSM sub-block decoders 510, 512, and 514. However, it is important to note that the computation of the reverse state metrics is independent of the forward state metrics. The forward decoder calculates metrics from the beginning to the end of a sub-block or segment while the reverse decoder calculates metrics from the end to the beginning of the sub-block. Forward and reverse decoders 506 and 508 perform their respective calculations independent of one another, with both decoders using the received data and a common trellis structure. In order to expedite the overall calculation of the likelihood ratios, the reverse state metric calculations by RSM segment decoders 516, 518, and/or 520 may be started even before the forward state metric calculation of a corresponding sub-block, by a FSM sub-block decoder 510, 512, and/or 514, is completed. Thus, once the forward state metric calculations are completed for a portion of a sub-block corresponding to a segment, the reverse state metric calculations can be started on that segment.

A storage device 522 may be coupled to forward decoder 506 to store the forward state metrics, and pass said metrics to a likelihood ratio calculator 524. Likelihood ratio calculator 524 calculates likelihood ratios based on the stored forward state metrics and the reverse state metrics received from the reverse decoder 508. In one implementation, the current set of forward state metrics and the calculated likelihood ratios are stored in memory 208 (FIG. 2). There is no need to store the reverse state metrics since the likelihood ratios are calculated along with the reverse state metrics.

In some implementations, forward decoder 506 and reverse decoder 508 may simultaneously (or nearly simultaneously) decode a sub-block. That is, the reverse decoder 508 does not wait until a segment of the code has been decoded by forward decoder 506. In such implementations, both the forward and reverse metrics may be stored in memory for calculating likelihood ratios. For example, the forward metrics for the first half of a sub-block may be stored along with the reverse metrics for the other half of the sub-block. The likelihood ratios may then be calculated as the forward and reverse state metrics for the sub-block are completed.

Figures 6, 9:
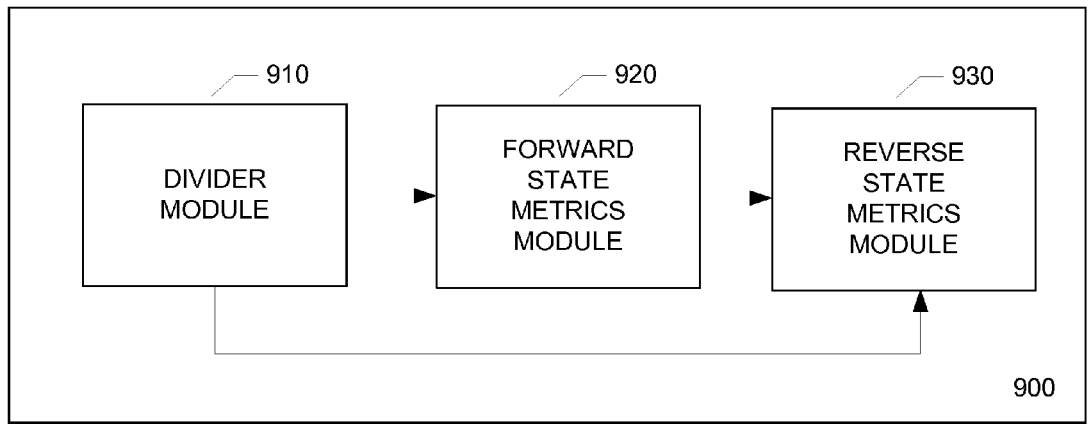
FIG. 6 is an example table illustrating the division and processing of data blocks by forward and reverse decoders.
FIG. 9 illustrates another example apparatus for decoding.

FIG. 6 is an example table illustrating the division and processing of data blocks by forward and reverse decoders. Generally, a data block is divided into FSM sub-blocks, which are processed in parallel for forward state metric calculations, and each sub-block may be further divided into smaller RSM sub-blocks or segments for reverse state metric calculations. In this example, a FSM sub-block has length 6×W and a RSM segment has length W. The forward state metric calculator (FSMC) is started at time T0. Once the first W forward state metrics have been calculated, the FSMC calculates the forward state metrics for segment 2×W (from W to 2W−1) at time T1. At approximately time T1, the reverse state metric calculator (RSMC) calculates reverse metrics from the first segment W (calculating in reverse order from W−1 to 0). At the next time period T2, the FSMC moves on to the next segment 3×W (from 2W to 3W−1) and the RSMC moves on to segment 2×W (calculating in reverse order from 2W−1 to W). This process continues until forward and reverse state metrics are completed for a FSM sub-block.

As the RSMC calculates the reverse state metrics for each segment, the log-likelihood ratios (LLR) (or other likelihood ratios) for the same segment are also calculated and stored in memory. Note that, according to some embodiments, the amount of memory storage utilized for storing forward state metrics is reduced by storing smaller number of forward state metrics. For instance, the current segment (e.g., 2×W) and previous segment (e.g., W) forward state metrics (e.g., $A_{0, 2W-1}$) are stored. The previous segment (e.g., W) forward state metrics ($A_{0, W-1}$) are used to calculate the LLR starting at time T1. This process continues until the LLRs are calculated for the whole sub-block. As the LLRs for a segment is computed, the forward state metrics for the previous segment can be discarded. Note that by processing the reverse state metrics for segments before the forward state metrics for the sub-block are completed, a smaller number of forward state metrics (e.g., metrics for two segments) are stored at any one time.

Figure 7:
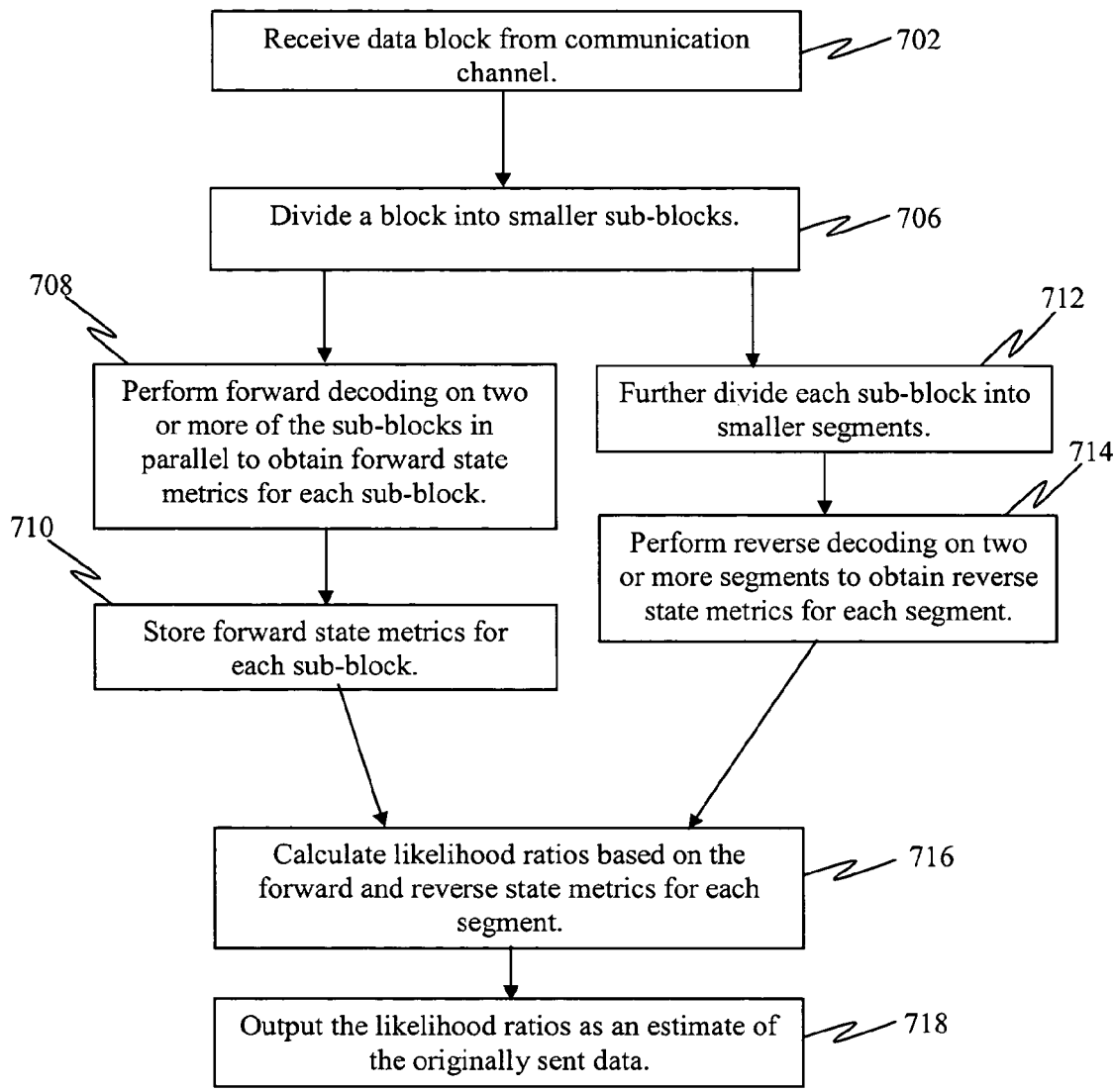
FIG. 7 is a flow diagram illustrating an example method for implementing recursive decoding with sliding windows on the forward and reverse decoding paths.

FIG. 7 is a flow diagram illustrating an example method for implementing a recursive decoding with sliding windows on the forward and reverse decoding paths. Note that in various implementations the present method may be applied to different decoding algorithms using a MAP or a log-MAP decoder, including decoding algorithms having two or more sequential or parallel decoding stages (e.g., inner and outer decoders, etc.). A data block (e.g., sequence of bits, symbols, etc.) is received from a communication channel 702. The data block is divided into smaller sub-blocks 706. In some implementations, after the first sub-block, each subsequent sub-block overlaps a previous sub-block by k time steps of the trellis. Forward decoding is performed on two or more of the sub-blocks in parallel 708 to obtain forward state metrics for each sub-block. When combined, the forward state metrics for each sub-block make up the forward state metrics for the trellis of the data block. In various implementations, forward decoding is performed in all of the sub-blocks of the data block. The forward state metrics (e.g., probabilities for each time step of the trellis) may optionally be stored for each sub-block 710.

In some implementations, the sub-blocks may be further divided into smaller segments 712 for processing by a subsequent decoding stage. Reverse decoding (e.g., backward path along the trellis) is performed on two or more segments in parallel 714 to obtain reverse state metrics for each segment. Note that some implementations may reduce the decoding time and/or save storage space by performing the reverse decoding 712 and 714 in parallel with the forward decoding. In particular, as forward state metrics for segments of the sub-blocks are obtained, the reverse decoding of those segments of the sub-blocks may be started. Thus, there is no need to wait until forward state metrics for a whole sub-block are completed before reverse decoding is started. In other implementations, forward and reverse decoding may be performed sequentially.

Likelihood ratios are calculated based on the forward and reverse state metrics 716. The likelihood ratios may be output as an estimate of the originally sent data 718.

In various implementations, the forward state metrics and reverse state metrics may be calculated approximately simultaneously or sequentially (e.g. forward state metrics followed by reverse state metrics or vice versa) for a sub-block or for a segment of the sub-block.

Even though some of the examples may illustrate one of these sequences and not others, it should be understood that the present invention may be applied to any of these configurations without departing from the invention.

Figure 8:
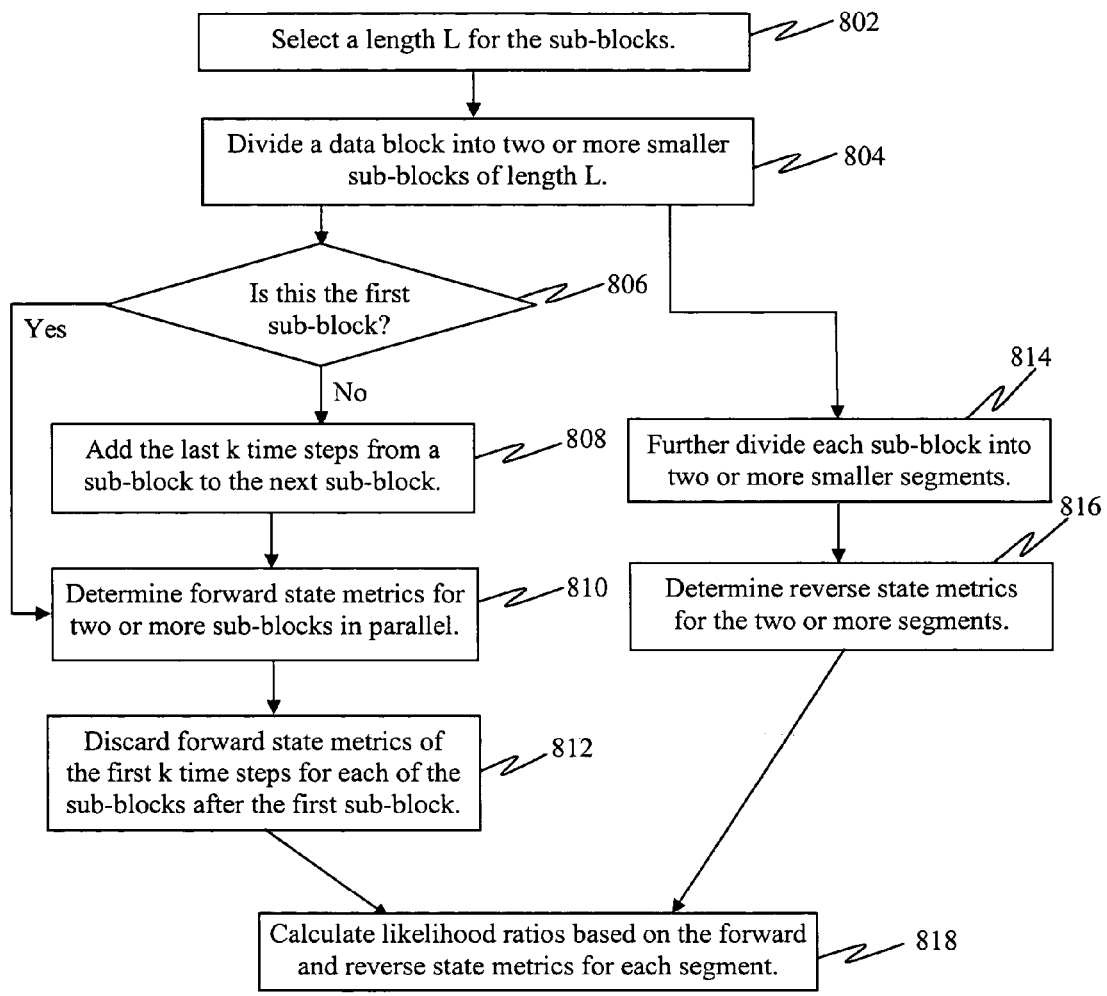
FIG. 8 is a flow diagram illustrating an example method for dividing a received data block in a two-stage decoder.

FIG. 8 is a flow diagram illustrating an example method for dividing a received data block in a two-stage decoder. A length L for the sub-blocks (e.g., sliding window) is selected 802 based on the decoding time constraint. The decoding time constraint is based on the application data rate. The higher the application data rate the faster the decoding requirements, meaning the sliding window has a smaller length L. The length L may be measured in bits, symbols, or trellis time steps in various implementations. In various implementations, the length L and/or time constraint may be dynamically determined during operation, configurable by a user, or during the design of hardware and/or software of a communication device/system.

A data block is divided into two or more smaller sub-blocks of length L 804. The block may have N time steps in its trellis and is divided into N/L sub-blocks. It is then determined if it is the first sub-block 806. Typically, the first sub-block starts from the zero state (a known state). If it is not the first sub-block, the last k time steps from a sub-block are added to the next sub-block 808. Thus, except for the first sub-blocks, all subsequent sub-blocks are of length L+k, with each sub-block overlapping with the previous sub-block by k time steps of the trellis. Forward state metrics of two or more sub-blocks (e.g., two or all sub-blocks or sliding windows) are then determined (computed) in parallel 810. The forward state metrics of the first k time steps in each sub-block, after the first sub-block, are then discarded 812. In an optional step, the sub-blocks may then be divided into two or more smaller segments 814. Reverse state metrics of two or more segments are then determined (computed) 816. Likelihood ratios are calculated based on the forward and reverse state metrics 818.

According to some implementations, the reverse state metrics for a segment are calculated while the forward state metrics for other portions of the corresponding sub-block are being determined. For instance, the forward and reverse metrics may be calculated in a sequence similar to that illustrated in FIG. 6.

Note that the memory usage of this algorithm is N/L times that of applying a sliding window architecture for the reverse state metric calculation alone. Additionally, the decoding time is reduced by N/L times because of the division of the data block into sub-blocks and the parallel processing on the forward decoding path.

Accordingly, a MAP decoder, or a turbo decoder having constituted MAP decoders, may be configured with bi-directional sliding windows. A sliding window architecture can be applied to the forward state metric (FSM) calculation of an encoded data block having a trellis with N time-steps. The data block is divided into smaller sub-blocks and a forward recursion of two or more of the sub-blocks are performed in parallel to obtain FSMs. Each sub-block overlaps with a previous sub-block by k time-steps, where k is an integer value greater than zero. This provides a good approximation of the FSMs at time-step k+t of the sub-block. The FSMs associated with the first k time steps of each sub-block, other than the first sub-block, are discarded. A reverse recursion of each sub-block is also performed to obtain reverse state metrics (RSM) for the sub-block. Likelihood ratios are then calculated based on the FSMs and RSMs.

The apparatus, methods, and algorithms described herein are particularly well suited for high data rate systems that use turbo or convolution codes. It is also a good solution for systems where the decoder speeds are too slow to achieve a desired data rate. By adding more parallel decoders, the effective data rate is increased.

In accordance with various implementations, the apparatuses of FIGS. 1, 2, 3, 4, 5 and/or 6 may be implemented in conjunction with one or more of the methods disclosed in FIGS. 7 and/or 8.

One or more of the components, steps, and/or functions illustrated in FIGS. 1, 2, 3, 4, 5, 6, 7 and/or 8 may be rearranged and/or combined into a single component, step, or function or embodied in several components, steps, or functions without departing from the invention. Additional elements, components, steps, and/or functions may also be added without departing from the invention. The apparatus, devices, and/or components illustrated in FIGS. 1, 2, 3, 4, 5 and/or 6 may be configured to perform one or more of the methods, features, or steps described herein.

It should be noted that the foregoing embodiments are merely examples and are not to be construed as limiting the invention. For example, a decoder may comprise means for dividing an encoded data block into a plurality of sub-blocks, the encoded data block having a trellis with N time steps, where N is an integer greater than zero; means for recursively obtaining forward state metrics for two or more of the sub-blocks in parallel; and means for recursively obtaining reverse state metrics for two or more of the sub-blocks in parallel. Here, the means for dividing may be comprised of a divider module 910 as shown in apparatus 900 of FIG. 9. The means for recursively obtaining forward state metrics may be comprised of a forward state metrics module 920 and the means for recursively obtaining reverse state metrics may be comprised of a reverse state metric module 930, as shown in apparatus 900.

Alternatively, one or more elements of apparatus 900 may be implemented by a processor configured to control and/or perform the functions of the one or more elements. Similarly, one or more elements of apparatus 900 may be implemented by a machine readable medium comprising instructions configured to perform the functions of the one or more elements.

Accordingly, the description of the embodiments is intended to be illustrative, and not to limit the scope of the claims. As such, the present teachings can be readily applied to other types of apparatuses and many alternatives, modifications, and variations will be apparent to those skilled in the art.

What is claimed is:

1. A decoder comprising:
   a block divider for dividing a data block into a plurality of sub-blocks using a sliding window architecture, wherein a length of each of the plurality of sub-blocks is dynamically determined based upon a decoding time constraint, wherein the decoding time constraint is dynamically determined during operation of a communication system receiving the data block based upon an application data rate;
   a first decoder coupled to the block divider to receive the plurality of sub-blocks, the first decoder including a plurality of parallel decoders that determine a first set of state metrics for at least two of the plurality of sub-blocks in parallel; and a second decoder coupled to the first decoder to receive the plurality of sub-blocks from the first decoder and compute a second set of state metrics for the plurality of sub-blocks.

2. The decoder of claim 1, wherein the first and second decoders implement a maximum a posteriori probability (MAP) algorithm to correct errors in the data block.

3. The decoder of claim 1, wherein the first decoder determines forward state metrics for a trellis of the data block.

4. The decoder of claim 3, wherein each sub-block overlaps with a previous sub-block by k time steps of the trellis, where k is an integer value greater than zero.

5. The decoder of claim 4, wherein the metrics associated with the first k time steps for each sub-block after a first sub-block are discarded from the first set of state metrics.

6. The decoder of claim 3, wherein the second decoder determines reverse state metrics for the trellis of the data block.

7. The decoder of claim 1, wherein the number of sub-blocks determines the number of parallel decoders in the first decoder.

8. The decoder of claim 1, wherein the data block is encoded with a turbo code.

9. The decoder of claim 1, wherein the parallel decoders in the first decoder are recursive decoders that calculate forward state metrics for each sub-block.

10. The decoder of claim 1, wherein the second decoder further divides each sub-block received from the first decoder into a plurality of smaller segments and computes the second set of state metrics using a sliding window architecture on the plurality of smaller segments.

11. The decoder of claim 1, further comprising:
a storage device to store the first set of state metrics.

12. The decoder of claim 11, wherein each sub-block includes a plurality of segments, the first set of metrics for a current and previous segments are stored in the storage device at any one time.

13. The decoder of claim 12, wherein the first set of metrics for a segment is discarded from the storage device once likelihood ratios for the segment have been calculated.

14. The decoder of claim 1, wherein the first set of state metrics and the second set of state metrics are used in calculating likelihood ratios for data in the data block.

15. The decoder of claim 1, wherein the second decoder includes a plurality of parallel decoders, each parallel decoder in the second decoder corresponding to one of the plurality of parallel decoders in the first decoder.

16. The decoder of claim 1, wherein each sub-block includes a plurality of segments, the second decoder is configured to compute the second set of state metrics for a segment once the first decoder has computed the first set of state metrics for that segment.

17. A method for recursively decoding information in an encoded data block, comprising:
dynamically selecting a sub-block length for the encoded data block based upon a decoding time constraint;
dividing the encoded data block into a plurality of smaller sub-blocks each having the selected sub-block length, each sub-block including a plurality of smaller segments, wherein a sliding window architecture is employed in dividing the encoded block so that each sub-block overlaps with a previous sub-block by k time steps of a trellis of the encoded block, where k is an integer value greater than zero;
obtaining forward state metrics for two or more of the sub-blocks in parallel;
obtaining reverse state metrics for a segment once forward state metrics have been obtained for that segment; and
discarding the forward state metrics associated with the first k time steps of each sub-block after a first sub-block.

18. The method of claim 17, wherein a sub-block starts with a first time step having a known binary state.

19. The method of claim 17, further comprising:
receiving the encode block of information having a trellis with N time steps;
dividing the encoded block into N/L sub-blocks, where L is an integer greater than zero; and
computing forward state metrics for the N/L sub-blocks in parallel.

20. The method of claim 17, further comprising:
obtaining likelihood ratios for data in the data block based on the first set of and second sets of state metrics.

21. The method of claim 17, wherein obtaining the forward state metrics of a sub-block, a starting step is an unknown state with equally likely state metrics.

22. The method of claim 17, further comprising:
storing the first set of metrics for a first segment of each sub-block;
obtaining likelihood ratios for the first segment based on the first and second state metrics for the first segment; and
discarding the first set of metrics for the first segment of each sub-block once likelihood ratios for the first segment are obtained.

23. A decoder comprising:
means for dividing an encoded data block into a plurality of sub-blocks, wherein a length of each of the plurality of sub-blocks is dynamically determined based upon a decoding time constraint, the encoded data block having a trellis with N time steps, where N is an integer greater than zero, wherein each sub-block overlaps with a previous sub-block by k time steps of the trellis of the encoded block, where k is an integer value greater than zero, and the forward state metrics associated with the first k time steps of each sub-block, after a first sub-block, are discarded;
means for recursively obtaining forward state metrics for two or more of the sub-blocks in parallel; and
means for recursively obtaining reverse state metrics for two or more of the sub-blocks in parallel.

24. The decoder of claim 23, wherein each sub-block includes a plurality of segments, the reverse state metrics are obtained for a segment once the forward state metrics for that segment have been obtained.

25. The decoder of claim 23, further comprising:
means for obtaining likelihood ratios for a segment based on the forward and reverse state metrics.

26. A processing device configured to control:
receiving an encoded data block having a state a trellis with N time steps, where N is a positive integer greater than two; and
recursive decoding of the encoded data block by dividing the encoded block into a plurality of sub-blocks, wherein a length of each of the plurality of sub-blocks is dynamically selected based upon a decoding time constraint, wherein each sub-block, after a first sub-block, overlaps with a previous sub-block by k time steps of the trellis, where k is an integer value greater than zero;
obtaining forward state metrics for two or more of the sub-blocks in parallel; and
discarding the forward state metrics associated with the first k time steps of each sub-block after a first sub-block, where k is an integer greater than zero.

27. The processing device of claim 26, wherein recursive decoding further comprises:
obtaining reverse state metrics for two or more of the sub-blocks.

28. The processing device of claim 27, wherein each sub-block includes a plurality of segments, reverse state metrics are obtained for a segment once the forward state metrics for that segment have been obtained.

29. A non-transitory machine readable storage medium comprising instructions for recursively decoding information in an encoded data block, the instructions configured to:
dynamically select a sub-block length for the encoded data block based upon a decoding time constraint during operation of a communication system receiving the encoded data block;
divide the encoded data block into a plurality of smaller sub-blocks each having the selected sub-block length, each sub-block including a plurality of smaller segments, wherein a sliding window architecture is employed in dividing the encoded block so that each sub-block overlaps with a previous sub-block by k time steps of a trellis of the encoded block, where k is an integer value greater than zero;
obtain forward state metrics for two or more of the sub-blocks in parallel;
obtain reverse state metrics for a segment once forward state metrics have been obtained for that segment; and
discarding the forward state metrics associated with the first k time steps of each sub-block after a first sub-block, where k is an integer greater than zero.

* * * * *